United States Patent
Lee et al.

(10) Patent No.: US 12,315,822 B2
(45) Date of Patent: May 27, 2025

(54) METHODS OF MANUFACTURING A FAN-OUT PANEL LEVEL SEMICONDUCTOR PACKAGE

(71) Applicant: SAMSUNG ELECTRONICS CO., LTD., Suwon-si (KR)

(72) Inventors: Jeongho Lee, Suwon-si (KR); Doohwan Lee, Cheonan-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 18/403,583

(22) Filed: Jan. 3, 2024

(65) Prior Publication Data

US 2024/0145397 A1    May 2, 2024

Related U.S. Application Data

(63) Continuation of application No. 17/306,555, filed on May 3, 2021, now Pat. No. 11,901,301.

(30) Foreign Application Priority Data

Jun. 25, 2020   (KR) .................. 10-2020-0078026

(51) Int. Cl.
*H01L 23/538*   (2006.01)
*H01L 21/48*    (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............ H01L 21/4853; H01L 21/4857; H01L 21/565; H01L 21/568; H01L 21/6835;
(Continued)

(56) References Cited

U.S. PATENT DOCUMENTS 9,633,974 B2   4/2017  Zhai et al.
9,865,525 B2   1/2018  Lin et al.
(Continued)

FOREIGN PATENT DOCUMENTS

KR   20170112363 A   10/2017
KR   101982040 B1    5/2019
(Continued)

*Primary Examiner* — Kyoung Lee
*Assistant Examiner* — Christina A Sylvia
(74) *Attorney, Agent, or Firm* — Myers Bigel, P.A.

(57) ABSTRACT

A semiconductor package includes a frame structure having a core portion and a lower pad under the core portion. A cavity penetrates the core portion, and a semiconductor chip is arranged in the cavity and has an active surface on which a bump pad is arranged and a non-active surface facing the active surface. A redistribution structure is positioned under the frame structure and the semiconductor chip, and is connected to the lower pad and the bump pad. A molding member covers the frame structure and the semiconductor chip and fills the cavity. The molding member surrounds a lower surface of the frame structure, the active surface of the semiconductor chip, the lower pad, and the bump pad.

15 Claims, 13 Drawing Sheets

(51) Int. Cl.
*H01L 21/56* (2006.01)
*H01L 21/683* (2006.01)
*H01L 23/00* (2006.01)
*H01L 23/31* (2006.01)
*H01L 25/10* (2006.01)
*H01L 25/18* (2023.01)

(52) U.S. Cl.
CPC .......... *H01L 21/565* (2013.01); *H01L 21/568* (2013.01); *H01L 21/6835* (2013.01); *H01L 23/3128* (2013.01); *H01L 23/3135* (2013.01); *H01L 23/5383* (2013.01); *H01L 23/5386* (2013.01); *H01L 24/16* (2013.01); *H01L 24/19* (2013.01); *H01L 24/20* (2013.01); *H01L 25/105* (2013.01); *H01L 25/18* (2013.01); *H01L 2221/68372* (2013.01); *H01L 2224/16227* (2013.01); *H01L 2224/214* (2013.01); *H01L 2225/1035* (2013.01); *H01L 2225/1058* (2013.01); *H01L 2924/1431* (2013.01); *H01L 2924/1434* (2013.01); *H01L 2924/18161* (2013.01)

(58) Field of Classification Search
CPC ........... H01L 23/5389; H01L 23/49816; H01L 23/49827; H01L 23/495; H01L 23/498; H01L 23/525; H01L 23/3128; H01L 23/3135; H01L 23/5383; H01L 23/5386; H01L 24/13; H01L 24/32; H01L 24/73; H01L 24/9216; H01L 24/19; H01L 24/20; H01L 24/10; H01L 25/105; H01L 25/18; H01L 2221/68372; H01L 2221/68345; H01L 2221/68359; H01L 2224/16227; H01L 2224/214; H01L 2224/0401; H01L 2224/04105; H01L 2224/12105; H01L 2224/131; H01L 2224/32225; H01L 2224/73204; H01L 2224/92125; H01L 2225/1035; H01L 2225/1058; H01L 2225/1041; H01L 2225/1076; H01L 2924/1431; H01L 2924/1434; H01L 2924/18161; H01L 2924/15192; H01L 2924/181; H01L 2924/15311

See application file for complete search history.

(56) References Cited

U.S. PATENT DOCUMENTS

| | | |
|---|---|---|
| 10,332,855 B2 | 6/2019 | Lee et al. |
| 10,410,970 B1 | 9/2019 | Chiu et al. |
| 10,950,539 B2 | 3/2021 | Kim et al. |
| 11,158,579 B2 * | 10/2021 | Lee .................. H01L 24/20 |
| 11,469,148 B2 | 10/2022 | Lee et al. |
| 2009/0315170 A1 | 12/2009 | Shim et al. |
| 2014/0252573 A1 | 9/2014 | Lin et al. |
| 2014/0319679 A1 | 10/2014 | Lin et al. |
| 2016/0056087 A1 | 2/2016 | Wu et al. |
| 2017/0133309 A1 * | 5/2017 | Kim .................. H01L 23/5389 |
| 2017/0287825 A1 | 10/2017 | Lee et al. |
| 2019/0131242 A1 | 5/2019 | Lee et al. |
| 2019/0189564 A1 | 6/2019 | Guzek |
| 2019/0273044 A1 | 9/2019 | Fu et al. |
| 2019/0311916 A1 | 10/2019 | Chavali et al. |
| 2020/0015357 A1 | 1/2020 | Kim et al. |
| 2020/0035590 A1 | 1/2020 | Tsai et al. |
| 2020/0075487 A1 | 3/2020 | Shin et al. |
| 2020/0105639 A1 | 4/2020 | Valavala et al. |
| 2020/0161203 A1 | 5/2020 | Kim et al. |
| 2020/0381405 A1 | 12/2020 | Patil et al. |

FOREIGN PATENT DOCUMENTS

| | | |
|---|---|---|
| KR | 20200031202 A | 3/2020 |
| KR | 20200062666 A | 6/2020 |

* cited by examiner

METHODS OF MANUFACTURING A FAN-OUT PANEL LEVEL SEMICONDUCTOR PACKAGE

CROSS-REFERENCE TO RELATED APPLICATION

This application is a continuation application of pending U.S. patent application Ser. No. 17/306,555, filed May 3, 2021, which is based on and claims priority under 35 U.S.C. § 119 to Korean Patent Application No. 10-2020-0078026, filed on Jun. 25, 2020, in the Korean Intellectual Property Office, the disclosure of which is incorporated by reference herein in its entirety.

BACKGROUND

The inventive concept relates to a semiconductor package, and more particularly, to a semiconductor package including a redistribution layer.

According to the rapid development of the electronics industry and the demands of users, electronic devices are becoming more compact and multifunctional. Accordingly, the need for miniaturization and multifunctionalization of semiconductor chips used in electronic devices is also increasing. To this end, a semiconductor chip having a fine-pitch connection terminal may be required, and a fine-sized electrode pad may be required to mount a high-capacity semiconductor chip in a structure of a limited semiconductor package. For this reason, there is a need for a redistribution layer for electrically connecting external connection terminals to fine-sized electrode pads included in a semiconductor package.

SUMMARY

The inventive concept provides a semiconductor package and a manufacturing method thereof, wherein, in the structure of a fan-out panel level package, reliability is improved by reducing a problem caused by a step difference between a semiconductor chip and a frame structure, thereby improving productivity and economy.

The inventive concept is not limited to the above objectives, but other objectives not described herein may be clearly understood by those of ordinary skill in the art from descriptions below.

According to an aspect of the inventive concept, there is provided a semiconductor package including: a frame structure having a core portion and a lower pad under the core portion, and wherein a cavity penetrates the core portion; a semiconductor chip arranged in the cavity, wherein the semiconductor chip has an active surface on which a bump pad is arranged and a non-active surface facing the active surface; a redistribution structure under the frame structure and the semiconductor chip, wherein the redistribution structure is connected to the lower pad and the bump pad; and a molding member that is on the frame structure and the semiconductor chip, and that is in the cavity, wherein the molding member surrounds a lower surface of the frame structure, the active surface of the semiconductor chip, the lower pad, and the bump pad.

According to another aspect of the inventive concept, there is provided a semiconductor package including: a first sub-package including a first semiconductor chip; a second sub-package on the first sub-package and including a second semiconductor chip; and a connection structure connecting the first sub-package to the second sub-package, wherein the first sub-package includes: a frame structure having a core portion and a lower pad under the core portion, wherein a cavity penetrates the core portion; wherein the first semiconductor chip is arranged in the cavity, wherein the first semiconductor chip has an active surface on which a bump pad is arranged and a non-active surface facing the active surface; a redistribution structure under the frame structure and the first semiconductor chip, wherein the redistribution structure is connected to the lower pad and the bump pad; and a molding member that is on the frame structure and the first semiconductor chip, and that is in the cavity, wherein the lower pad protrudes from the core portion, the bump pad protrudes from the active surface, and a lower surface of the lower pad, a lower surface of the bump pad, and a lower surface of the molding member are coplanar.

According to another aspect of the inventive concept, there is provided a semiconductor package including: a frame structure having a core portion, an upper pad on the core portion, a lower pad under the core portion, and a through via that connects the upper pad to the lower pad, and wherein a cavity penetrates the core portion; a semiconductor chip arranged in the cavity and having an active surface on which a bump pad is arranged and a non-active surface facing the active surface; a redistribution structure under the frame structure and the semiconductor chip and including a redistribution line and a redistribution via connected to the redistribution line, the redistribution via having a tapered shape that increases in width as a distance from the semiconductor chip increases; a molding member that is on the frame structure, the semiconductor chip, and the redistribution structure, and that is in the cavity; and an external connection terminal arranged under the redistribution structure and electrically connected to the redistribution line and the redistribution via, wherein the molding member surrounds all surfaces of the semiconductor chip, a lower surface of the frame structure, an upper surface of the redistribution structure, a side surface of the lower pad, and a side surface of the bump pad.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
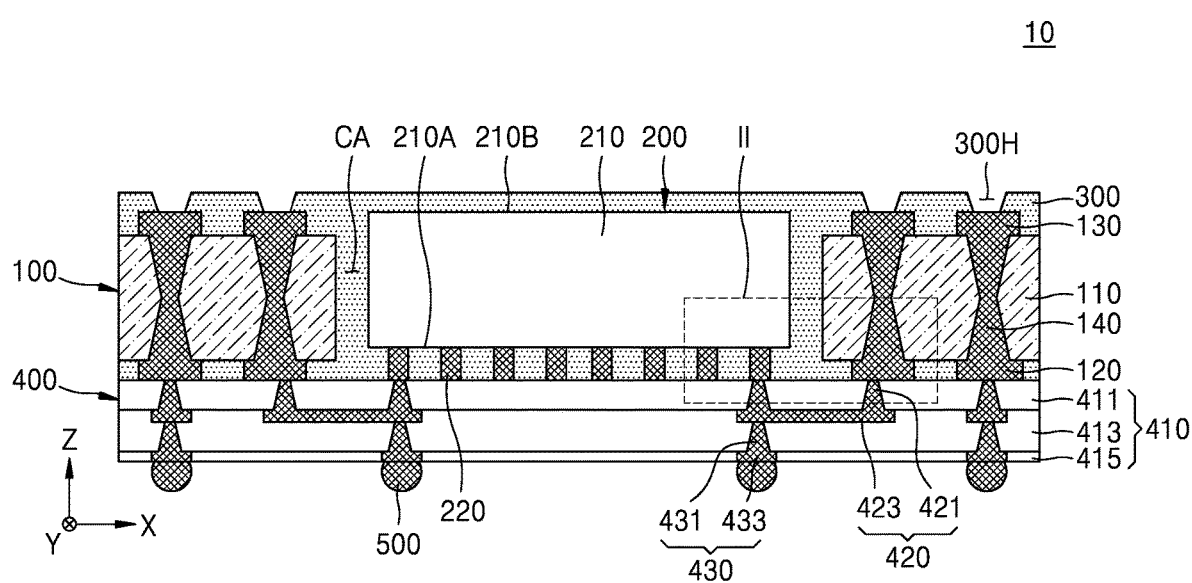
FIG. 1 is a cross-sectional view of a semiconductor package according to an embodiment.
Figure 2:
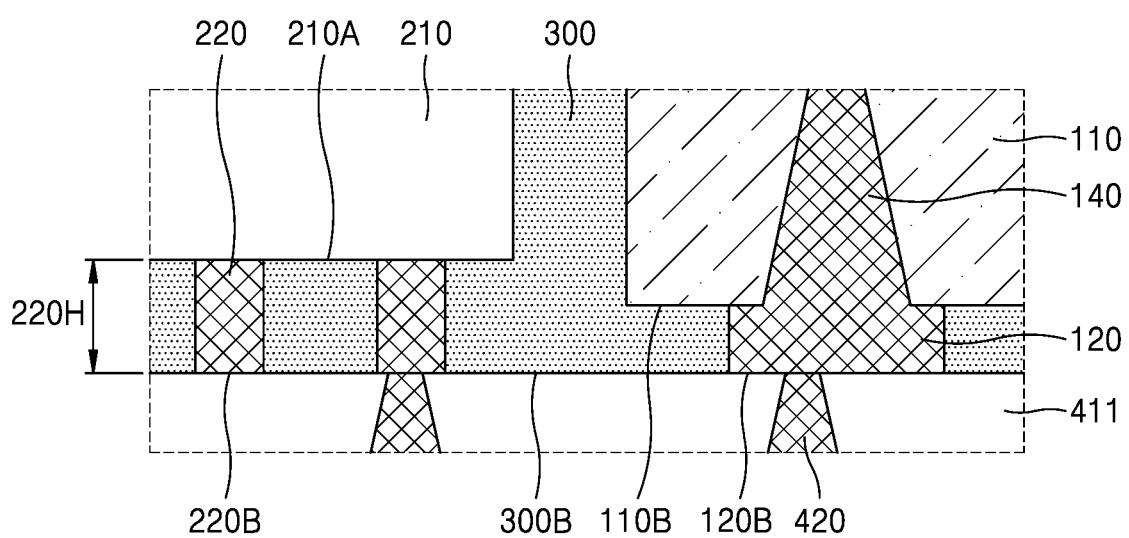
FIG. 2 is an enlarged cross-sectional view of portion II of FIG. 1.

FIG. 1 is a cross-sectional view of a semiconductor package according to an embodiment, and FIG. 2 is an enlarged cross-sectional view of portion II of FIG. 1.

Referring to FIGS. 1 and 2 together, a semiconductor package 10 includes a frame structure 100 having a cavity CA, a semiconductor chip 200 arranged in the cavity CA, a molding member 300 covering the frame structure 100 and the semiconductor chip 200 and filling the cavity CA, and a redistribution structure 400 under the frame structure 100 and the semiconductor chip 200.

The semiconductor package 10 according to the inventive concept may include the frame structure 100 and the semiconductor chip 200. With the recent miniaturization of semiconductor chips, such as the semiconductor chip 200, and an increase in the number of input/output terminals, there is a limit in that external connection terminals 500 serving as input/output terminals are all accommodated in a main surface of the semiconductor chip 200. Accordingly, a fan-out panel level package (FO-PLP) structure is applied to the semiconductor package 10 such that the redistribution structure 400 is extended to the frame structure 100 arranged on an outer circumferential surface of the semiconductor chip 200 to include an external connection terminal 500.

In addition, the semiconductor package 10 according to the inventive concept may be implemented by a chip-first manufacturing method in which the semiconductor chip 200 is first arranged in the cavity CA of the frame structure 100 and the redistribution structure 400 is formed later, in the FO-PLP structure.

The frame structure 100 includes a core portion 110 having the cavity CA. In addition, the frame structure 100 includes a lower pad 120 protruding from the core portion 110 on one side thereof, an upper pad 130 protruding from the core portion 110 on the other side thereof, and a through via 140 penetrating the core portion 110.

FIG. 1 shows that the frame structure 100 includes one layer of the core portion 110, but is not limited thereto. The core portion 110 constituting the frame structure 100 may include a plurality of layers.

The material of the core portion 110 is not particularly limited as long as the material of the core portion 110 supports the semiconductor package 10. For example, the core portion 110 may be made of an insulating material, a metal having excellent rigidity and thermal conductivity, glass, ceramic, plastic, or the like. A thickness of the frame structure 100 is not particularly limited, and may be designed according to a thickness of the semiconductor chip 200. For example, depending on the type of the semiconductor chip 200, the thickness of the frame structure 100 may be about 100 µm to about 500 µm. The frame structure 100 may have a large size with a plurality of cavities CA for mass production of the semiconductor package 10. The semiconductor package 10 may be manufactured by first manufacturing a plurality of semiconductor packages and then singulating the semiconductor packages into individual semiconductor packages through a sawing process.

In the frame structure 100, the lower pad 120, the upper pad 130, and the through via 140 serve as a conductive wiring pattern. The conductive wiring pattern may include a conductive material such as copper (Cu), aluminum (Al), silver (Ag), tin (Sn), gold (Au), nickel (Ni), lead (Pb), titanium (Ti), or an alloy thereof. The conductive wiring pattern may perform various functions according to a design purpose. For example, the conductive wiring pattern may serve as a ground pattern, a power pattern, or a signal pattern.

The lower pad 120 and the upper pad 130 may be formed to protrude from the core portion 110. The through via 140 electrically connects the lower pad 120 to the upper pad 130 formed at different levels, thereby forming an electrical path in the frame structure 100. In some embodiments, the through via 140 may be completely filled with a conductive material. In other embodiments, unlike illustrated, the through via 140 may be formed of a conductive material along a wall surface of a hole. The through via 140 may be formed in a tapered shape, a cylindrical shape, or the like, and in particular, may be formed in an hourglass shape with a concave middle portion.

Because the lower pad 120 protrudes from the core portion 110, a side surface of the lower pad 120 may be surrounded by the molding member 300. In addition, according to a manufacturing method of the semiconductor package 10 according to the inventive concept, a lower surface 120B of the lower pad 120 may be a flat surface, and the lower surface 120B of the lower pad 120 may be scratched due to the grinding. In addition, a surface roughness of the lower surface 120B of the lower pad 120 may be substantially the same as a surface roughness of a lower surface 220B of a bump pad 220 to be described later below. For example, an arithmetical average roughness Ra of the surface roughness may be about 100 nm to about 200 nm, but is not limited thereto.

A surface treatment layer (not shown) may be formed on a portion of the upper pad 130 exposed through an opening 300H formed in the molding member 300. The surface treatment layer may include, for example, a metal layer formed by electrolytic plating or electroless plating, an organic solderability preservative (OSP) layer, or the like.

The semiconductor chip 200 may be a logic chip or a memory chip. The logic chip may be, for example, a microprocessor, an analog device, or a digital signal processor. In addition, the memory chip may be, for example, a volatile memory chip such as dynamic random access memory (DRAM) or static RAM (SRAM), or a nonvolatile memory chip such as phase-change RAM (PRAM), magnetic RAM (MRAM), resistive RAM (RRAM), or ferroelectric RAM (FeRAM). In some embodiments, the semiconductor chip 200 may be a high bandwidth memory chip. In some embodiments, the semiconductor package 10 may include a plurality of semiconductor chips 200.

The semiconductor chip 200 may be understood as a concept including a semiconductor device including an integrated circuit. In more detail, the semiconductor chip 200 may include a semiconductor substrate 210 having an active surface 210A and anon-active surface 210B facing each other. A circuit portion for implementing an integrated circuit function of the semiconductor chip 200 may be formed on the active surface 210A of the semiconductor substrate 210 through a semiconductor manufacturing process. That is, metal wiring layers, interlayer insulating layers arranged therebetween, and individual unit devices may be formed on the semiconductor substrate 210.

The semiconductor substrate 210 may be a wafer including silicon (Si). In some embodiments, the semiconductor substrate 210 is a wafer including a semiconductor element such as germanium (Ge), or a compound semiconductor such as silicon carbide (SiC), gallium arsenide (GaAs), indium arsenide (InAs), and indium phosphide (InP). Meanwhile, the semiconductor substrate 210 may have a silicon on insulator (SOI) structure. In addition, the semiconductor substrate 210 may have a semiconductor device area including a transistor, an active area, and a field area.

In addition, the semiconductor chip 200 may include the bump pad 220 formed on the semiconductor substrate 210 to extend a function of the circuit unit to the outside. The bump pad 220 may be formed to protrude from the active surface 210A of the semiconductor substrate 210.

A peripheral portion of the bump pad 220 may be covered by a protective layer formed on the active surface 210A of the semiconductor substrate 210. The protective layer may physically and chemically protect a semiconductor device of the active surface 210A of the semiconductor substrate 210. The protective layer may include, for example, an inorganic insulating material such as silicon oxide, silicon nitride, or silicon oxynitride, an organic insulating material such as an insulating polymer, or an insulating material formed of a combination thereof.

The bump pad 220 may be, for example, a polygonal column such as a square column, a hexagonal column, or an octagonal column, or may be a cylinder. The bump pad 220 may be formed to have a certain size or more to withstand electrical and mechanical stress. The bump pad 220 may be formed to have a certain height 220H on the active surface 210A of the semiconductor substrate 210. The height 220H may be about 5 μm to about 20 μm, but is not limited thereto. In other words, the height 220H may be the thickness of the bump pad 220.

That is, due to the bump pad 220, the semiconductor substrate 210 may be arranged to be apart from the redistribution structure 400. Further, due to the bump pad 220, the level of the active surface 210A and the level of a lower surface 110B of the core portion 110 may be different from each other. In addition, according to the manufacturing method of the semiconductor package 10 according to the inventive concept, the lower surface 220B of the bump pad 220 may be a flat surface, and the lower surface 220B of the bump pad 220 may be scratched due to grinding. In addition, a surface roughness of the lower surface 220B of the bump pad 220 may be substantially the same as a surface roughness of the lower surface 120B of the lower pad 120 described above. For example, the arithmetical average roughness Ra of the surface roughness may be about 100 nm to about 200 nm, but is not limited thereto.

The molding member 300 may protect the semiconductor chip 200 from external influences such as contamination and impact. In order to perform this role, the molding member 300 may include a thermosetting resin such as an epoxy resin, a thermoplastic resin such as polyimide, or a resin including a reinforcing material such as an inorganic filler therein. In more detail, the molding member 300 may include Ajinomoto Build up Film (ABF), Flame Retardant 4 (FR-4), Bismaleimide Triazine (BT), or the like. Further, as the molding member 300, a molding material such as an epoxy mold compound or a photosensitive material such as Photo Imagable Encapsulant (PIE) may be used. In addition, the molding member 300 may be formed by a process such as compression molding, lamination, and screen printing.

The molding member 300 may surround all surfaces of the semiconductor chip 200. In other words, the molding member 300 may be formed to cover all of the active surface 210A, the non-active surface 210B, and a side surface connecting the active surface 210A to the non-active surface 210B of the semiconductor chip 200. In addition, the molding member 300 may cover an upper surface, the lower surface 110B, and some side surfaces of the core portion 110. In addition, according to the manufacturing method of the semiconductor package 10 according to the inventive concept, the molding member 300 may be formed to surround the side surface of the lower pad 120 and a side surface of the bump pad 220. In some embodiments, the lower surface 120B of the lower pad 120, the lower surface 220B of the bump pad 220, and a lower surface 300B of the molding member 300 may be located on the same plane. In other words, the molding member 300 may be formed to fill between lower pads 120 and between bump pads 220 and contact an upper surface of the redistribution structure 400.

The upper surface of the redistribution structure 400 may be a flat surface. The redistribution structure 400 may include redistribution conductive layers 420 and 430 including two layers on a redistribution insulating layer 410. However, the inventive concept is not limited thereto, and the redistribution structure 400 may include redistribution conductive layers 420 and 430 including a greater or less number of layers.

The redistribution conductive layers 420 and 430 are formed of, for example, Cu, Ni, Au, chromium (Cr), Ti, or palladium (Pd), or may be formed of an alloy thereof. In some embodiments, the redistribution conductive layers 420 and 430 may be formed by an electroplating process.

The redistribution conductive layers 420 and 430 may include redistribution vias 421 and 431, which are tapered in a trapezoid shape, and a redistribution line 423 respectively contacting the redistribution vias 421 and 431. The redistribution line 423 may be arranged along a plane formed in a first direction (X direction) and a second direction (Y direction) perpendicular to the first direction (X direction). In addition, the redistribution line 423 may include a plurality of layers in a third direction (Z direction) perpendicular to both the first direction (X direction) and the second direction (Y direction). A width of the redistribution vias 421 and 431 in the first direction (X direction) may increase away from the semiconductor chip 200 in the third direction (Z direction). This may be a feature according to a chip-first manufacturing method in which the semiconductor chip 200 is first mounted before the redistribution structure 400 is formed.

The redistribution conductive layers 420 and 430 may electrically connect the external connection terminal 500 to the bump pad 220 of the semiconductor chip 200. In more detail, the first conductive layer 420 may be arranged under the frame structure 100 and the semiconductor chip 200, and the bump pad 220 and the first conductive layer 420 may be directly connected to each other. The second conductive layer 430 may be arranged under the first conductive layer 420, and the first conductive layer 420 and the second conductive layer 430 may be directly connected to each other.

In addition, the redistribution insulating layer 410 may be formed as an insulating protective layer around the redistribution conductive layers 420 and 430. The redistribution insulating layer 410 may include a polymer, benzocyclobutene, or resin, and may include a photosensitive polyimide if necessary. However, the material constituting the redistribution insulating layer 410 is not limited thereto. For example, the redistribution insulating layer 410 may include silicon oxide, silicon nitride, or silicon oxynitride.

In the redistribution insulating layer 410, a first insulating layer 411 is arranged under the frame structure 100 and the semiconductor chip 200, and may include a first via 421. A second insulating layer 413 may be arranged under the first insulating layer 411, and may include a second via 431. A lower insulating layer 415 is may be under the second insulating layer 413, and may expose a lower surface of the connection pad 433.

The connection pad 433 is electrically connected to individual unit devices of the semiconductor chip 200 through the redistribution structure 400, and may electrically connect a function of a circuit portion of the semiconductor chip 200 to the external connection terminal 500. That is, the connection pad 433 may also be referred to as under bump metal (UBM). In some embodiments, the connection pad 433 may be a Cu pad.

The external connection terminal 500 may be a solder ball or a solder bump. In some embodiments, a lead-free solder including Sn may be used as a material constituting the external connection terminal 500. The external connection terminal 500 may be electrically connected to the redistribution structure 400 through the connection pad 433. Further, through the external connection terminal 500, the semiconductor package 10 may be connected to an external device such as a motherboard including a printed circuit board (PCB).

In a general FO-PLP structure, a frame structure having an embedded trace is used, and a cap pad having a thickness much less than that of a bump pad, not a commonly used bump pad, needs to be applied to a semiconductor chip mounted on such a frame structure. Accordingly, a process of forming the cap pad on the semiconductor chip needs to be separately performed.

In addition, inspection of a semiconductor substrate with the cap pad causes more wear of a probe of an inspection device than inspection of the semiconductor substrate with the commonly used bump pad, and thus the probe needs to be replaced frequently. For these reasons, there may be a problem in that the production costs of a semiconductor package may increase.

In addition, in the general FO-PLP structure, after a process of forming a molding member covering the periphery of the semiconductor chip, a step difference is generated at the interface between the semiconductor chip and the frame structure, thereby limiting circuit design. In addition, because an area in which three or more types of materials come into contact with the interface, the semiconductor package is vulnerable to thermal shock. For these reasons, there may be a problem in that the reliability of a semiconductor package may deteriorate.

In order to solve these problems, in the semiconductor package 10 according to the inventive concept, the bump pad 220 rather than the cap pad may be used as it is, and thus, there is no change in the existing supply chain, and it is possible to solve the problem of the replacement cycle of the probe during the inspection process of the semiconductor substrate.

In addition, because the semiconductor package 10 according to the inventive concept is flattened using grinding on the lower surface 220B of the bump pad 220, and the step difference at the interface between the frame structure 100 and the semiconductor chip 200 is minimized, it may be easier to design a fine circuit. In addition, because the area in which three or more types of materials come into contact with the interface, reliability against thermal shock may be improved.

Ultimately, in the semiconductor package 10 according to the inventive concept, the step difference between the frame structure 100 and the semiconductor chip 200 in the FO-PLP structure is removed by a flattening process to improve reliability, thereby improving productivity and economy.

Figure 3:
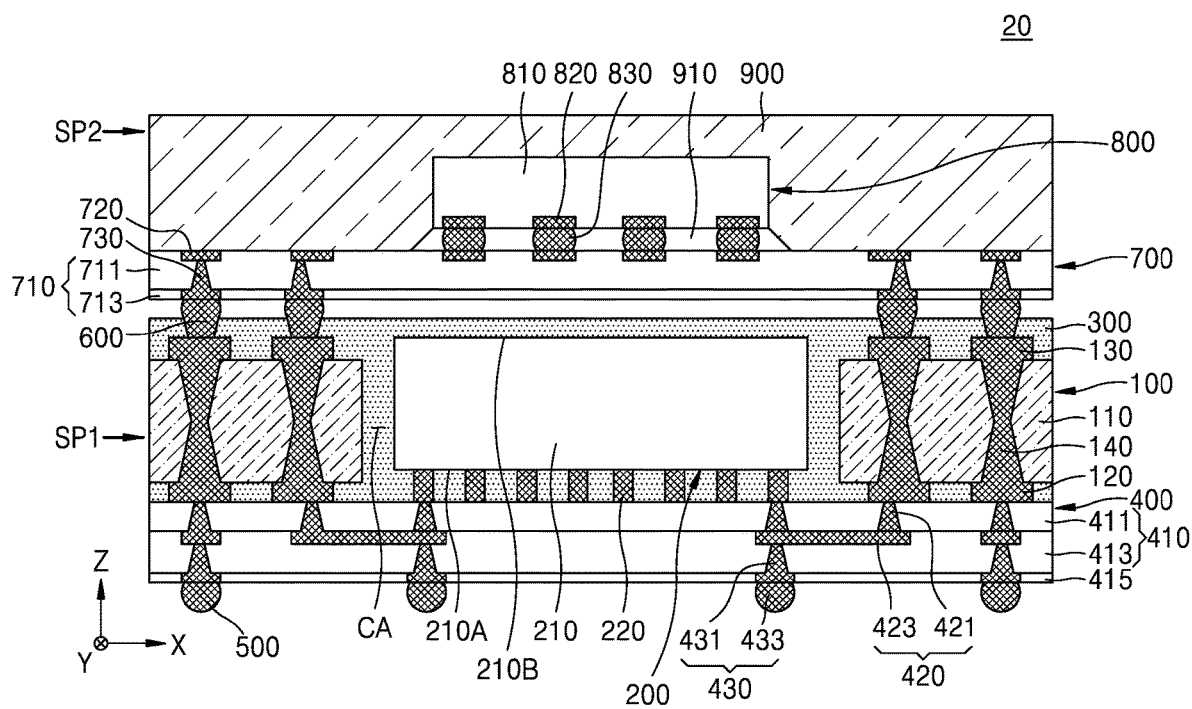
FIG. 3 is a cross-sectional view of a semiconductor package according to another embodiment.

FIG. 3 is a cross-sectional view of a semiconductor package according to another embodiment.

Most of the components constituting the illustrated semiconductor package 20 are described later below and materials constituting the components are substantially the same as or similar to those described with respect to FIGS. 1 and 2. Therefore, for convenience of description, the description will focus on differences from the semiconductor package 10 described above.

Referring to FIG. 3, the semiconductor package 20 includes a first sub-package SP1 including the first semiconductor chip 200, a second sub-package SP2 including a second semiconductor chip 800, and a connection structure 600 connecting the first sub-package SP1 to the second sub-package SP2.

In the semiconductor package 20 according to the inventive concept, an FO-PLP structure and a package on package (PoP) structure may be simultaneously applied. In other words, by connecting the first sub-package SP1 including the first semiconductor chip 200 and the second sub-package SP2 including the second semiconductor chip 800 with the connection structure 600, one semiconductor package 20 may be configured. The first semiconductor chip 200 and the second semiconductor chip 800 may be of different types. For example, the first semiconductor chip 200 may be a controller chip, and the second semiconductor chip 800 may be a memory chip, but are not limited thereto.

The first sub-package SP1 may include the frame structure 100 surrounding a side surface of the first semiconductor chip 200. The frame structure 100 is a structure for supporting the semiconductor package 20, and through this, the rigidity and secure uniform thickness may be maintained. The frame structure 100 has an upper surface and a lower surface facing each other, and the cavity CA is formed to penetrate between the upper surface and the lower surface of the frame structure 100. The first semiconductor chip 200 is arranged in the cavity CA so as to be apart from the frame structure 100, and as a result, the lateral periphery of the first semiconductor chip 200 is surrounded by the frame structure 100.

The frame structure 100 may include the through via 140 penetrating therein. The through via 140 may penetrate the core portion 110 of the frame structure 100. The upper pad 130 on the through via 140 may be electrically connected to the connection structure 600.

The first sub-package SP1 may be substantially the same as the semiconductor package 10 (see FIG. 1) described above.

The second sub-package SP2 may include the second semiconductor chip 800, a second redistribution structure 700 under the second semiconductor chip 800, and an underfill 910 for reinforcing connection between the second semiconductor chip 800 and a solder ball 830, and may further include a second molding member 900 that protects the second semiconductor chip 800 from external influences such as contamination and impact.

That is, the second redistribution structure 700 may include second redistribution conductive layers 720 and 730 in a second redistribution insulating layer 710. The second redistribution insulating layer 710 may include an upper insulating layer 711 and a lower insulating layer 713. The second semiconductor chip 800 may include a second semiconductor substrate 810 and a connection pad 820 formed therein. The solder ball 830 may be attached to the connection pad 820.

In the semiconductor package 20 according to the inventive concept, most features included in the first sub-package SP1 may be substantially equally applied to the second sub-package SP2.

Figure 4:
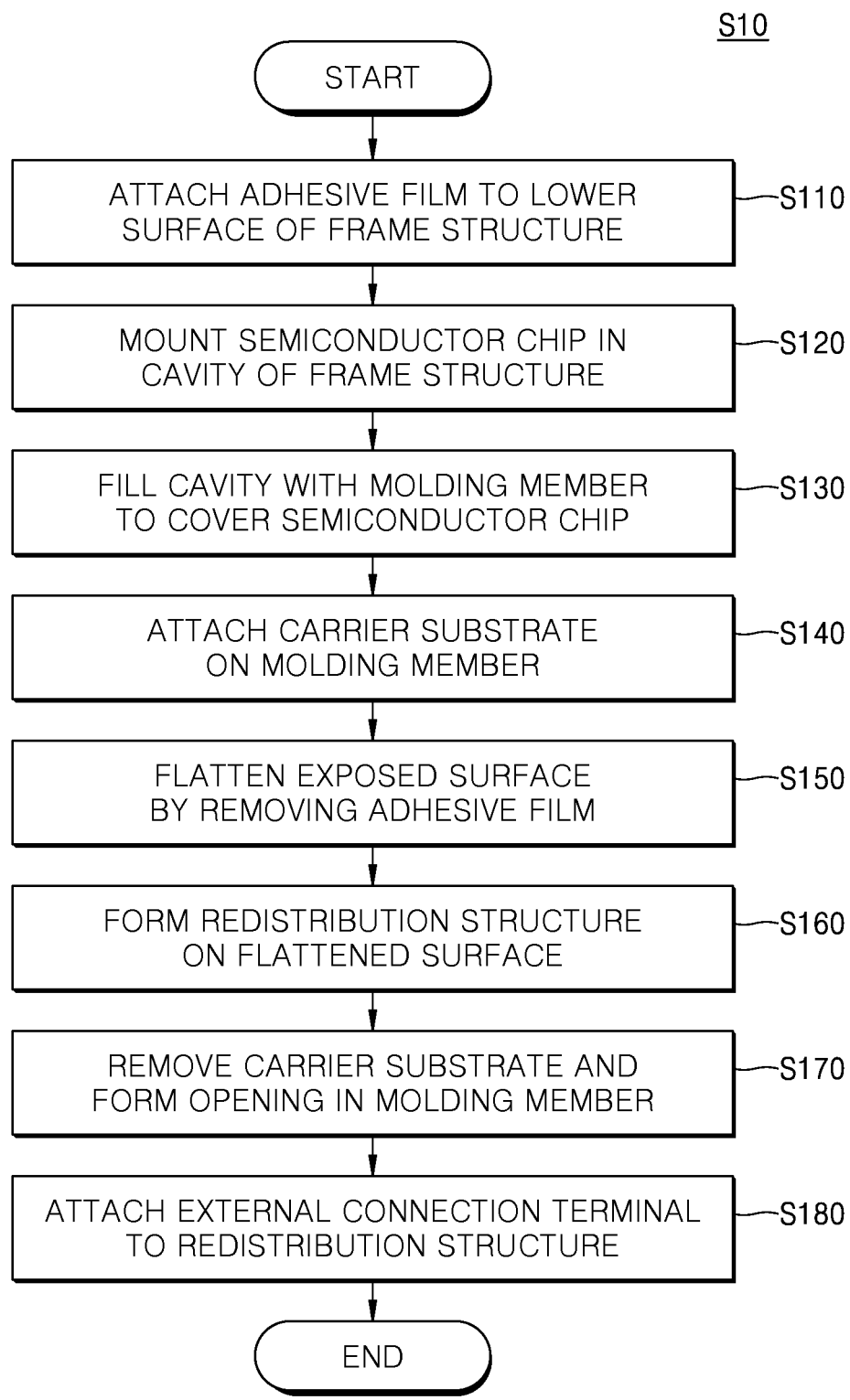
FIG. 4 is a flowchart illustrating a manufacturing method of a semiconductor package according to an embodiment.

FIG. 4 is a flowchart illustrating a manufacturing method S10 of a semiconductor package according to an embodiment.

Referring to FIG. 4, the manufacturing method S10 of a semiconductor package may include a process sequence of first to eighth operations S110 to S180.

When a certain embodiment may be implemented differently, a specific process order may be performed differently from the described order. For example, two consecutively described processes may be performed substantially at the same time or performed in an order opposite to the described order.

The manufacturing method S10 of the semiconductor package according to the inventive concept may include first operation S110 of attaching an adhesive film to a lower surface of a frame structure, second operation S120 of mounting a semiconductor chip in a cavity of the frame structure, third operation S130 of filling the cavity with a molding member to cover a semiconductor chip, fourth operation S140 of attaching a carrier substrate on the molding member, fifth operation S150 of flattening an exposed surface by removing the adhesive film, sixth operation S160 of forming a redistribution structure on the flattened surface, seventh operation S170 of removing the carrier substrate and forming an opening in the molding member, and eighth operation S180 of attaching an external connection terminal to the redistribution structure.

Technical features of first to eighth operations S110 to S180 will be described in detail with reference to FIGS. 5 to 12 to be described later.

FIGS. 5 to 12 are views illustrating a manufacturing method of a semiconductor package according to an embodiment, according to a process sequence.

Figure 5:
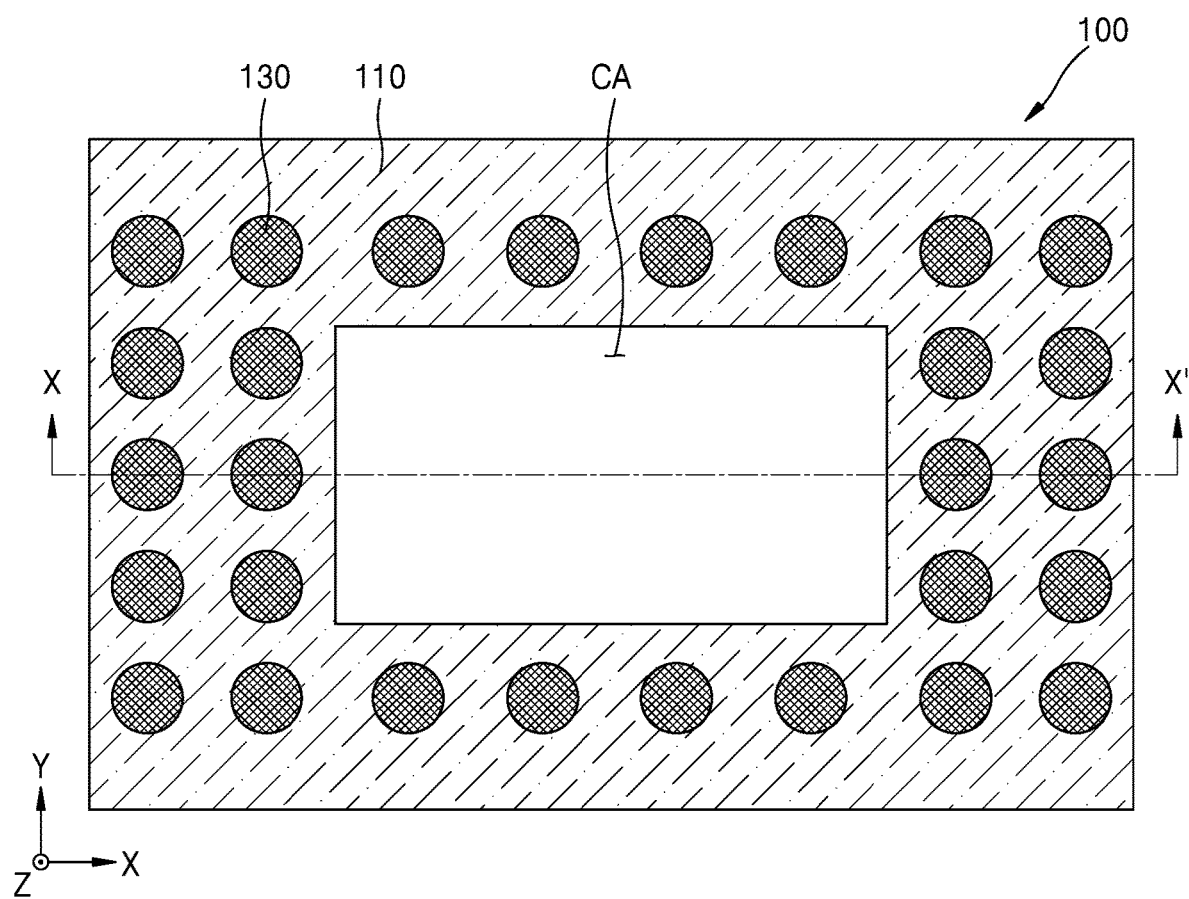
FIGS. 5 to 12 are views illustrating a manufacturing method of a semiconductor package according to an embodiment, according to a process sequence.

Referring to FIG. 5, the frame structure 100 having the cavity CA is prepared. The frame structure 100 is shown in a plan view.

The frame structure 100 includes the core portion 110 having the cavity CA. In addition, the frame structure 100 includes the lower pad 120 (see FIG. 6) protruding from the core portion 110 on one side thereof, the upper pad 130 protruding from the core portion 110 on the other side thereof, and the through via 140 (see FIG. 6) penetrating the core portion 110.

The material of the core portion 110 of the frame structure 100 may be, for example, an insulating material, a metal having excellent rigidity and thermal conductivity, glass, ceramic, plastic, or the like. The thickness of the frame structure 100 may be, for example, about 100 μm to about 500 μm. In some embodiments, the frame structure 100 may have a large size with a plurality of cavities CA for mass production.

The lower pad 120 (see FIG. 6) and the upper pad 130 may be formed to protrude from the core portion 110. The through via 140 (see FIG. 6) electrically connects the lower pad 120 (see FIG. 6) to the upper pad 130 formed at different levels, thereby forming an electrical path in the frame structure 100. The through via 140 (see FIG. 6) may be formed in a tapered shape, a cylindrical shape, or the like, and in particular, may be formed in an hourglass shape with a concave middle portion.

Figure 6:
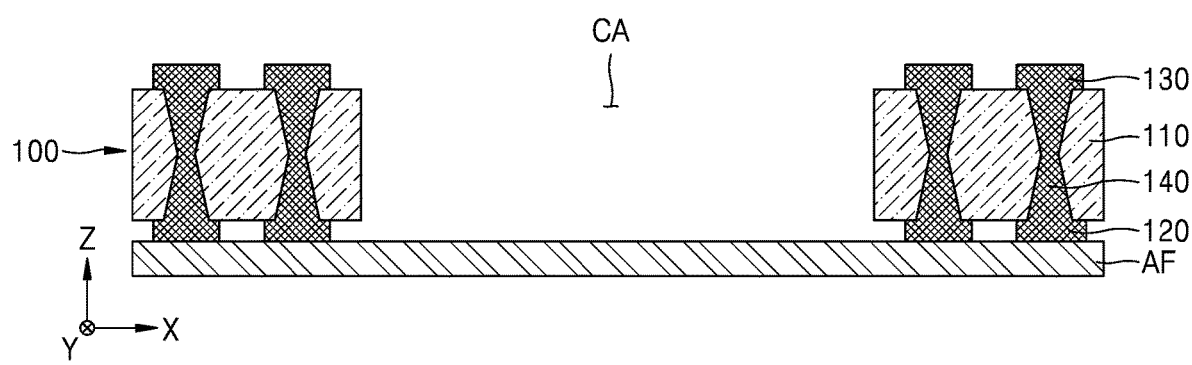

Referring to FIG. 6, an adhesive film AF is attached to one side of the frame structure 100 on which the lower pad 120 is formed. The frame structure 100 is shown in a cross-sectional view taken along line X-X' of FIG. 5.

Any adhesive film AF may be used as long as it adheres to the frame structure 100, and a known adhesive tape or the like may be used. The known adhesive tape may include, for example, a heat treatment curable adhesive tape with weakened adhesion by heat treatment, an ultraviolet curable adhesive tape with weakened adhesion by UV irradiation, or the like.

The adhesive film AF is adhered to a lower surface of the lower pad 120 and may be arranged to be apart from the core portion 110. That is, an empty space may be formed between the lower pads 120.

Figure 7:
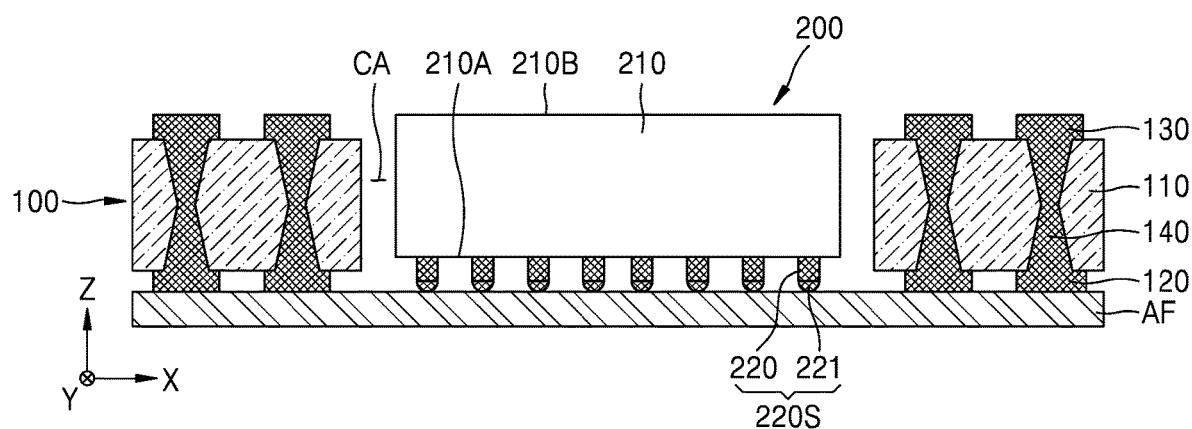

Referring to FIG. 7, the semiconductor chip 200 is arranged in the cavity CA of the frame structure 100.

In a face-down method of attaching a bump structure 220S of the semiconductor chip 200 on the adhesive film AF of the cavity CA, the semiconductor chip 200 is arranged on the frame structure 100. That is, the semiconductor chip 200 is mounted such that the active surface 210A of the semiconductor chip 200 and an upper surface of the adhesive film AF face each other.

Figure 8:
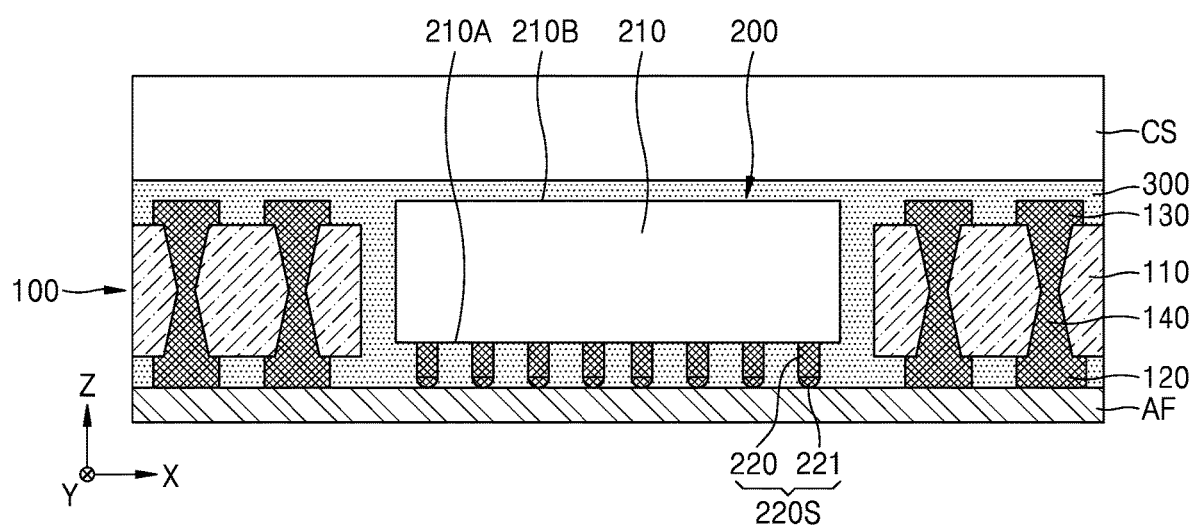

The adhesive film AF is directly adhered to a bump protrusion 221 of the bump structure 220S and may be arranged to be apart from the active surface 210A of the semiconductor chip 200. That is, an empty space may be formed between bump structures 220S. Referring to FIG. 8, the cavity CA (see FIG. 7) of the frame structure 100 is filled with the molding member 300 to cover the semiconductor chip 200.

The molding member 300 covers the frame structure 100 and the semiconductor chip 200 and fills the remaining space of the cavity CA (see FIG. 7). For example, the molding member 300 may be formed by laminating a resin for forming the molding member 300 in an uncured state and curing the resin. As the lamination process, a method of separating a work tool from the resin by pressing and decompressing the resin at a high temperature for a certain period of time and cooling the resin to room temperature may be used. Alternatively, the molding member 300 may be formed by coating and curing the resin for forming the molding member 300 in an uncured state. As the coating process, a screen printing method in which ink is applied by a squeeze, or a spray printing method in which ink is sprayed and applied may be used. The semiconductor chip 200 is fixed to the frame structure 100 by the curing.

The molding member 300 may surround all surfaces of the semiconductor chip 200. In other words, the molding member 300 may be formed to cover all of the active surface 210A, the non-active surface 210B, and a side surface connecting the active surface 210A to the non-active surface 210B of the semiconductor chip 200. In addition, the molding member 300 may cover an upper surface, a lower surface, and some side surfaces of the core portion 110. In addition, the molding member 300 may be formed to surround a side surface of the lower pad 120 and a side surface of the bump structure 220S. In other words, the molding member 300 may be formed to fill between the lower pads 120 and between the bump structures 220S.

Subsequently, a carrier substrate CS may be attached to the molding member 300. The carrier substrate CS may include, for example, glass or aluminum oxide. In order to facilitate attachment of the carrier substrate CS, an adhesive layer (not shown) may be formed between the carrier substrate CS and the molding member 300. The adhesive layer may be in a liquid form or a gel form that may be easily deformed under a certain pressure.

Figure 9:
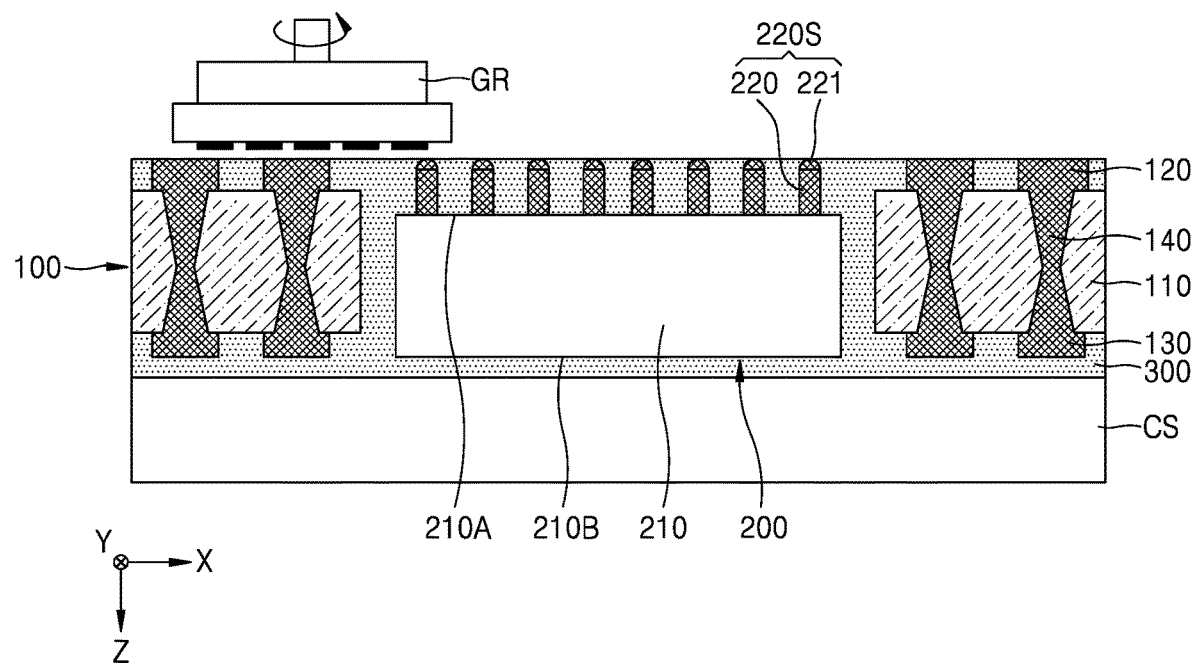

Referring to FIG. 9, the adhesive film AF (see FIG. 8) is removed, and a planarization process is performed on an exposed surface due to the removal of the adhesive film AF (see FIG. 8).

First, the adhesive film AF (see FIG. 8) is removed. When a heat treatment curable adhesive tape is used as the adhesive film AF (see FIG. 8), the heat treatment curable adhesive tape may be removed by weakening the adhesive force by heat treatment. Alternatively, when an ultraviolet curable adhesive tape is used as the adhesive film AF (see FIG. 8), the ultraviolet curable adhesive tape may be removed by irradiating ultraviolet rays to weaken the adhesive force.

Figure 10:
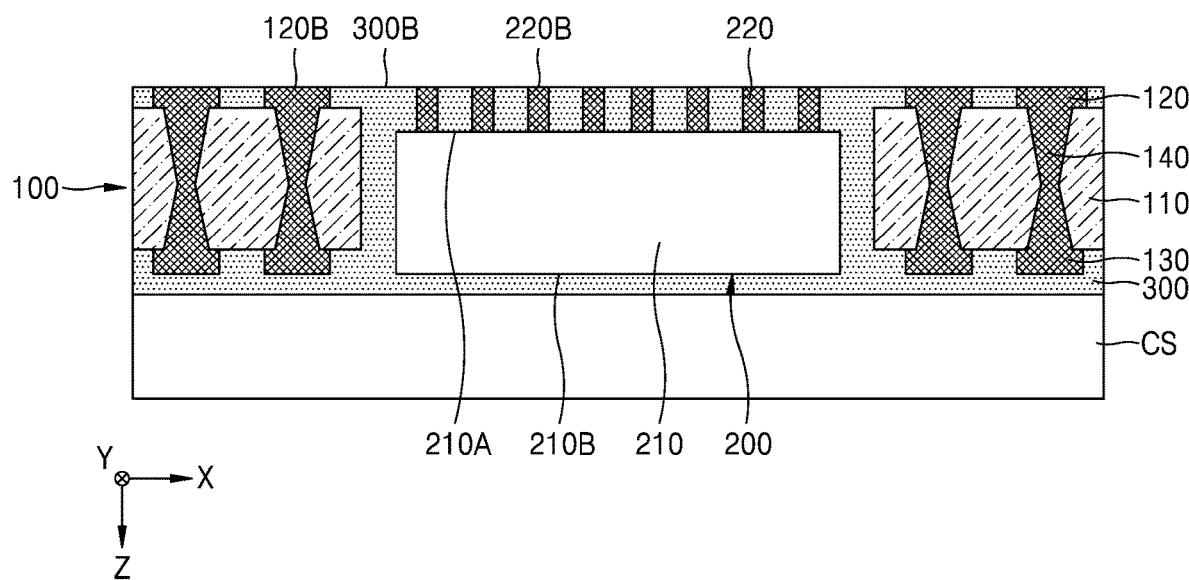

Subsequently, the carrier substrate CS is turned over to face down, and a planarization process is performed using a grinder GR on the exposed surface due to the removal of the adhesive film AF (see FIG. 8). The lower pad 120, the bump structure 220S, and the molding member 300 may be on the exposed surface due to the removal of the adhesive film AF (see FIG. 8). That is, the grinder GR may remove a portion of the lower pad 120, a portion of the bump structure 220S, and a portion of the molding member 300 through a grinding process. Referring to FIG. 10, through the planarization process, the lower surface 120B of the lower pad 120, the lower surface 220B of the bump pad 220, and the lower surface 300B of the molding member 300 may form the same flat plane.

By the planarization process, the bump protrusion 221 (see FIG. 9) is completely removed, and the lower surface 220B of the bump pad 220 may be exposed. The lower surface 220B of the bump pad 220 may be a flat surface, and the lower surface 220B of the bump pad 220 may be scratched due to the operation of the grinder GR (see FIG. 9). Further, due to the operation of the grinder GR (see FIG. 9), the surface roughness of the lower surface 220B of the bump pad 220 may be substantially the same as the surface roughness of the lower surface 120B of the lower pad 120. For example, the arithmetical average roughness Ra of the surface roughness may be about 100 nm to about 200 nm, but is not limited thereto.

Because all step differences that may be between the frame structure 100 and the semiconductor chip 200 are removed through such a planarization process, in a subsequent process, a circuit design of the redistribution structure 400 (see FIG. 11) is possible based on a flat surface, so it is easy to design a fine circuit.

Figure 11:
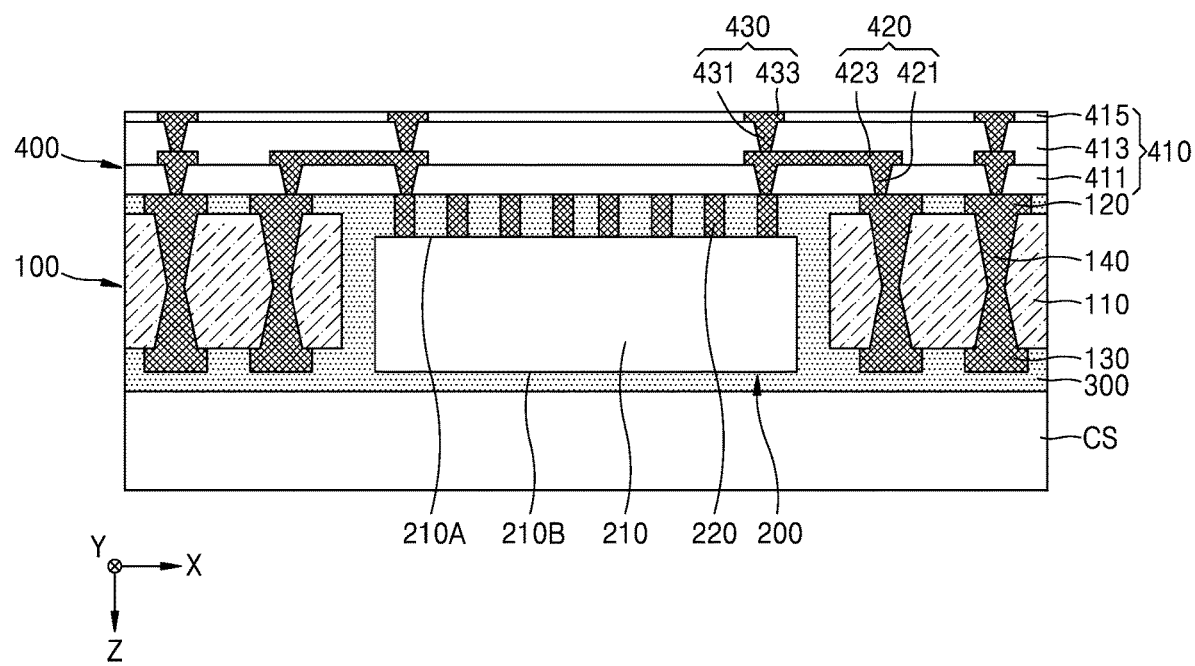

Referring to FIG. 11, the redistribution structure 400 is formed on a flat surface constituted by the lower surface 120B of the lower pad 120, the lower surface 220B of the bump pad 220, and the lower surface 300B of the molding member 300.

The redistribution structure 400 may be formed on the flat surface. The redistribution structure 400 may include the redistribution conductive layers 420 and 430 including two layers on the redistribution insulating layer 410.

The redistribution conductive layers 420 and 430 may include the redistribution vias 421 and 431, which are tapered in a trapezoid shape, and the redistribution lines 423 respectively contacting the redistribution vias 421 and 431. The width of the redistribution vias 421 and 431 in the first direction (X direction) may increase away from the semiconductor chip 200 in the third direction (Z direction). This may be a feature according to the chip-first manufacturing method in which the semiconductor chip 200 is first mounted before the redistribution structure 400 is formed.

Figure 12:
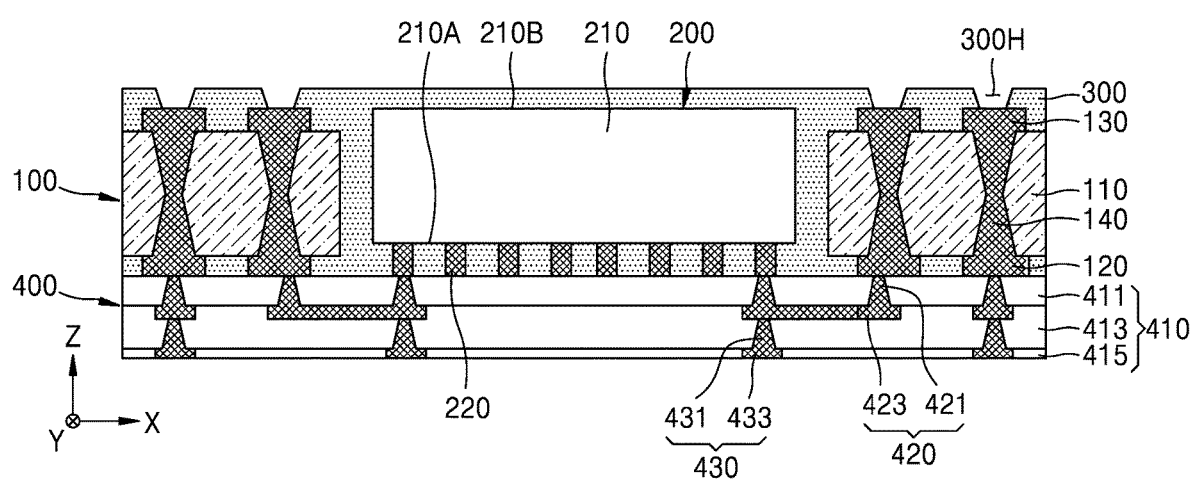

Referring to FIG. 12, the carrier substrate CS (see FIG. 11) is removed, and the opening 300H exposing a portion of the upper pad 130 is formed in the molding member 300.

First, a laser beam may be irradiated onto the carrier substrate CS (see FIG. 11) to separate and remove the carrier substrate CS (see FIG. 11). In some embodiments, a bonding force between an adhesive layer (not shown) and the carrier substrate CS (see FIG. 11) may be weakened by the irradiation of the laser beam. Next, a residual adhesive layer may be removed using an etchant. The removal of the residual adhesive layer may be performed by wet etching or dry etching. In other embodiments, the adhesive layer may be immediately removed by irradiation of the laser beam.

Subsequently, the redistribution structure 400 is turned over to face down, and the opening 300H is formed in the molding member 300 and exposes a portion of the upper pad 130. The opening 300H may be formed through a photo and etching process. Because the photo and etching process corresponds to a conventional technique, a detailed description will not be given herein.

A surface treatment layer (not shown) may be formed on a portion of the upper pad 130 exposed through the opening 300H formed in the molding member 300. The surface treatment layer may include, for example, a metal layer formed by electrolytic plating or electroless plating, an OSP layer, or the like.

Referring again to FIG. 1, the external connection terminal 500 is attached to the connection pad 433. The external connection terminal 500 may be a solder ball or a solder bump. In some embodiments, a lead-free solder including Sn may be used as the material constituting the external connection terminal 500. The external connection terminal 500 may be electrically connected to the redistribution structure 400 through the connection pad 433.

Using such a manufacturing method, in the semiconductor package 10 according to the inventive concept, the step difference between the frame structure 100 and the semiconductor chip 200 in the FO-PLP structure is removed by a flattening process to improve reliability, thereby improving productivity and economy.

Figure 13:
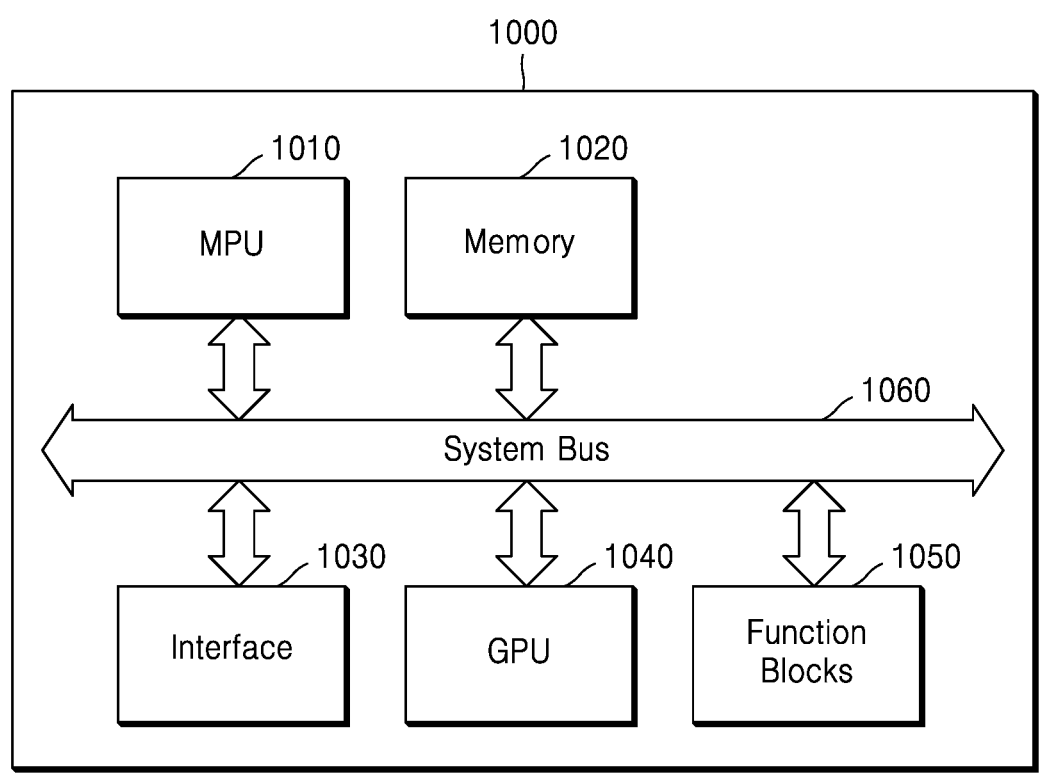
FIG. 13 is a configuration diagram of a semiconductor package according to embodiments.

FIG. 13 is a configuration diagram of a semiconductor package according to embodiments.

Referring to FIG. 13, a semiconductor package 1000 may include a micro processing unit 1010, a memory 1020, an interface 1030, a graphics processing unit 1040, functional blocks 1050, and a bus 1060 connecting them to each other. The semiconductor package 1000 may include both the micro processing unit 1010 and the graphics processing unit 1040, or may include only one of them.

The micro processing unit 1010 may include a core and a cache. For example, the micro processing unit 1010 may include multiple cores. Each of the multiple cores may have the same or different performance. In addition, each core of the multiple cores may be activated at the same time or at different times.

The memory 1020 may store a result of processing by the functional blocks 1050 under the control of the micro processing unit 1010. The interface 1030 may exchange information or signals with external devices. The graphics processing unit 1040 may perform graphics functions. For example, the graphics processing unit 1040 may perform a video codec or may process 3D graphics. The functional blocks 1050 may perform various functions. For example, when the semiconductor package 1000 is an application processor used in a mobile device, some of the functional blocks 1050 may perform a communication function.

The semiconductor package 1000 may include any one of the semiconductor packages 10 and 20 described with respect to FIGS. 1 to 3 above.

While the inventive concept has been particularly shown and described with reference to embodiments thereof, it will be understood that various changes in form and details may be made therein without departing from the scope of the following claims.

What is claimed is:

1. A method of manufacturing a semiconductor package, the method comprising:
   preparing a frame structure comprising a core portion and a plurality of lower pads under the core portion, wherein a cavity penetrates the core portion;
   attaching an adhesive film to each of the plurality of lower pads of the frame structure;
   mounting a semiconductor chip in the cavity of the frame structure, wherein the semiconductor chip comprises an active surface on which a plurality of bump pads are arranged and a non-active surface opposite the active surface;
   forming a molding member to cover the frame structure and the semiconductor chip;
   attaching a carrier substrate to the molding member;
   performing a planarization process on a first surface that is exposed by removing the adhesive film, wherein each of the plurality of bump pads of the semiconductor chip has a polygonal column shape or cylindrical shape;
   forming a redistribution structure on the first surface that is planarized;
   forming an opening portion in the molding member through a second surface that is exposed by removing the carrier substrate; and
   attaching an external connection terminal to the redistribution structure.

2. The method of claim 1, wherein the molding member surrounds all surfaces of the semiconductor chip.

3. The method of claim 1, wherein the planarization process is performed to allow a lower surface of the lower pad, lower surfaces of the plurality of bump pads, and a lower surface of the molding member to be coplanar.

4. The method of claim 3, wherein a lower surface of the core portion and the active surface are spaced apart from the redistribution structure by a distance.

5. The method of claim 3, wherein, through the planarization process, the lower surfaces of the plurality of bump pads have planarized surfaces.

6. The method of claim 5, wherein, through the planarization process, a surface-roughness of the lower surface of the lower pad is substantially equal to a surface roughness of the lower surfaces of the plurality of bump pads.

7. The method of claim 1, wherein the frame structure further comprises:
   a plurality of upper pads on the core portion; and
   a plurality of through vias that connect the plurality of upper pads and the plurality of lower pads, wherein the plurality of through vias have an hourglass shape with a concave middle portion.

8. The method of claim 1, wherein the molding member fills between the plurality of lower pads and between the plurality of bump pads, and
   the molding member is in contact with an upper surface of the redistribution structure.

9. The method of claim 1, wherein the plurality of bump pads have a thickness of about 5 μm to about 20 μm from the active surface to an upper surface of the redistribution structure.

10. The method of claim 1, wherein the redistribution structure comprises a redistribution line and a redistribution via connected to the redistribution line, wherein the redistribution via has a tapered shape that increases in width as a distance from the semiconductor chip increases.

11. A method of manufacturing a semiconductor package, the method comprising:
    forming a first sub-package comprising a first semiconductor chip;
    forming a second sub-package comprising a second semiconductor chip; and
    stacking the second sub-package on the first sub-package using a connection structure,
    wherein the forming of the first sub-package comprises:
    preparing a frame structure comprising a core portion and a plurality of lower pads under the core portion, wherein a cavity penetrates the core portion;
    attaching an adhesive film to each of the plurality of lower pads of the frame structure;
    mounting the first semiconductor chip in the cavity of the frame structure, wherein the first semiconductor chip comprises an active surface on which a plurality of bump pads are arranged and a non-active surface opposite the active surface;
    forming a molding member to cover the frame structure and the first semiconductor chip;
    attaching a carrier substrate to the molding member;
    performing a planarization process on a first surface that is exposed by removing the adhesive film, wherein each of the plurality of bump pads of the first semiconductor chip has a polygonal column shape or a cylindrical shape;
    forming a redistribution structure on the first surface that is planarized; and
    forming an opening portion in the molding member through a second surface that is exposed by removing the carrier substrate.

12. The method of claim 11, wherein the frame structure comprises:
    an upper pad on the core portion; and
    a through via connecting the upper pad to the lower pad, and
    the connection structure is formed in the opening portion and connected to the upper pad.

13. The method of claim 11, wherein the molding member surrounds all surfaces of the first semiconductor chip, a lower surface of the frame structure, an upper surface of the redistribution structure, a side surface of the lower pad, and side surfaces of the plurality of bump pads.

14. The method of claim 11, wherein, through the planarization process, a surface roughness of a lower surface of the lower pad is substantially equal to a surface roughness of lower surfaces of the plurality of bump pads.

15. The method of claim 11, wherein the first semiconductor chip and the second semiconductor chip are of different types.

* * * * *